(12) United States Patent
Mihaylov et al.

(10) Patent No.: US 10,692,705 B2
(45) Date of Patent: Jun. 23, 2020

(54) ADVANCED OPTICAL SENSOR AND METHOD FOR DETECTING AN OPTICAL EVENT IN A LIGHT EMISSION SIGNAL IN A PLASMA CHAMBER

(71) Applicant: Tokyo Electron Limited, Minato-ku, Tokyo (JP)

(72) Inventors: Mihail Mihaylov, San Jose, CA (US); Xinkang Tian, Fremont, CA (US); Ching-Ling Meng, Sunnyvale, CA (US); Jason Ferns, Sunnyvale, CA (US); Joel Ng, San Leandro, CA (US); Badru D. Hyatt, Fremont, CA (US); Zheng Yan, San Jose, CA (US); Vi Vuong, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 15/351,916

(22) Filed: Nov. 15, 2016

(65) Prior Publication Data

US 2017/0140905 A1 May 18, 2017

Related U.S. Application Data

(60) Provisional application No. 62/255,573, filed on Nov. 16, 2015.

(51) Int. Cl.
*H01J 37/32* (2006.01)
*G01J 1/46* (2006.01)
(Continued)

(52) U.S. Cl.
CPC .......... *H01J 37/32917* (2013.01); *G01J 1/42* (2013.01); *G01J 1/46* (2013.01); *H01J 37/32944* (2013.01);
(Continued)

(58) Field of Classification Search
CPC .......... H01J 37/32917; H01J 37/32972; H01J 37/32944; G01J 1/46; G01J 1/42;
(Continued)

(56) References Cited

U.S. PATENT DOCUMENTS 3,059,611 A 10/1962 Fury
3,612,692 A 10/1971 Kruppa et al.
(Continued)

FOREIGN PATENT DOCUMENTS

CN 101038860 A 9/2007
CN 101221891 A 7/2008
(Continued)

OTHER PUBLICATIONS

International Search Report and Written Opinion dated Mar. 12, 2018 in PCT/US2017/062316, citing documents AA and AO through AQ therein, 13 pages.
(Continued)

*Primary Examiner* — Que Tan Le
*Assistant Examiner* — Jennifer D Bennett
(74) *Attorney, Agent, or Firm* — Oblon, McClelland, Maier & Neustadt, L.L.P.

(57) ABSTRACT

An advanced optical sensor and method for detection of optical events in a plasma processing system. The method includes detecting at least one light emission signal in a plasma processing chamber. The at least one detected light emission signal including light emissions from an optical event. The method further includes processing the at least one light emission signal and detecting a signature of the optical event from the processed light emission signal.

23 Claims, 11 Drawing Sheets

(51) Int. Cl.
*G01J 1/42* (2006.01)
*G01J 3/443* (2006.01)
*G01J 3/28* (2006.01)

(52) U.S. Cl.
CPC ........... *H01J 37/32972* (2013.01); *G01J 3/28* (2013.01); *G01J 3/2803* (2013.01); *G01J 3/443* (2013.01); *G01J 2001/4247* (2013.01)

(58) Field of Classification Search
CPC ...... G01J 3/443; G01J 3/28; G01J 2001/4247; G01J 3/2803
See application file for complete search history.

(56) References Cited

U.S. PATENT DOCUMENTS

| | | | |
|---|---|---|---|
| 4,147,435 A | 4/1979 | Habegger | |
| 5,014,217 A | 5/1991 | Savage | |
| 5,308,414 A | 5/1994 | O'Neill et al. | |
| 5,347,460 A | 9/1994 | Gifford et al. | |
| 5,353,790 A | 10/1994 | Jacques et al. | |
| 5,450,205 A | 9/1995 | Sawin et al. | |
| 5,751,416 A | 5/1998 | Singh et al. | |
| 5,980,767 A | 11/1999 | Koshimizu et al. | |
| 6,060,328 A | 5/2000 | En et al. | |
| 6,081,334 A | 6/2000 | Grimbergen et al. | |
| 6,090,302 A | 7/2000 | Smith, Jr. et al. | |
| 6,132,577 A | 10/2000 | Smith, Jr. et al. | |
| 6,381,008 B1 | 4/2002 | Branagh et al. | |
| 6,535,779 B1 | 3/2003 | Birang et al. | |
| 6,564,114 B1 | 5/2003 | Toprac et al. | |
| 6,582,618 B1 | 6/2003 | Toprac et al. | |
| 6,745,095 B1* | 6/2004 | Ben-Dov | H01L 22/26 257/E21.528 |
| 6,815,653 B2 | 11/2004 | Tsay et al. | |
| 6,825,920 B2 | 11/2004 | Lam et al. | |
| 6,830,939 B2 | 12/2004 | Harvey et al. | |
| 6,952,657 B2* | 10/2005 | Jahns | G05B 23/0254 702/182 |
| 6,958,484 B2 | 10/2005 | Mitrovic | |
| 7,241,397 B2 | 7/2007 | Fink et al. | |
| 7,328,126 B2 | 2/2008 | Chamness | |
| 7,334,477 B1 | 2/2008 | Pirkle | |
| 7,591,923 B2 | 9/2009 | Mitrovic et al. | |
| 8,048,326 B2 | 11/2011 | Yue et al. | |
| 8,173,451 B1 | 5/2012 | Tian et al. | |
| 8,415,884 B2 | 4/2013 | Chen et al. | |
| 8,416,509 B2 | 4/2013 | Yi et al. | |
| 8,513,583 B2 | 8/2013 | Corke et al. | |
| 8,553,218 B2 | 10/2013 | Tinnemans et al. | |
| 9,200,950 B2 | 12/2015 | Lian et al. | |
| 9,842,726 B2 | 12/2017 | Daniels et al. | |
| 2002/0029851 A1 | 3/2002 | Edamura et al. | |
| 2002/0139925 A1* | 10/2002 | Mitrovic | G01N 21/68 250/226 |
| 2003/0054655 A1* | 3/2003 | Nakano | G01N 21/51 438/710 |
| 2004/0008336 A1 | 1/2004 | Lam et al. | |
| 2004/0026035 A1* | 2/2004 | Mitrovic | G01J 3/443 156/345.24 |
| 2004/0058359 A1 | 3/2004 | Mei et al. | |
| 2004/0104681 A1 | 6/2004 | Mitrovic | |
| 2006/0285108 A1* | 12/2006 | Morrisroe | F23C 99/003 356/316 |
| 2008/0186473 A1 | 8/2008 | Lee | |
| 2008/0285202 A1* | 11/2008 | Boyd | H01L 21/67069 361/234 |
| 2009/0280581 A1 | 11/2009 | Hudson | |
| 2011/0174776 A1 | 7/2011 | Kabe et al. | |
| 2012/0085494 A1 | 4/2012 | Uchida et al. | |
| 2012/0101622 A1* | 4/2012 | Yun | H01J 37/32935 700/110 |
| 2013/0016344 A1 | 1/2013 | Bullock et al. | |
| 2013/0141720 A1 | 6/2013 | Park et al. | |
| 2014/0097359 A1* | 4/2014 | Vasic | G01N 21/6408 250/459.1 |
| 2014/0209453 A1* | 7/2014 | Jun | H01J 37/32972 204/192.33 |
| 2015/0069912 A1* | 3/2015 | Valcore, Jr. | H03J 7/00 315/111.21 |
| 2015/0241272 A1 | 8/2015 | Lian et al. | |
| 2016/0268108 A1 | 9/2016 | Daniels et al. | |

FOREIGN PATENT DOCUMENTS

| | | |
|---|---|---|
| CN | 102282654 A | 12/2011 |
| EP | 0 652 415 A1 | 10/1994 |
| JP | 2005-527984 A | 9/2005 |
| KR | 10-2012-0126418 A | 11/2012 |
| TW | 589659 B | 6/2004 |
| WO | WO 2015/130433 A1 | 9/2015 |

OTHER PUBLICATIONS

Chinese Office Action dated Oct. 31, 2016 in Chinese Patent Application No. 201380054482.2 (with English translation).
Japanese Office Action dated Jul. 5, 2016 in Japanese Patent Application No. 2015-537813 (with English translation).
Ventzek, P.L.G., et al., "Formation, Nature, and Stability of the Arsenic-Silicon-Oxygen Alloy for Plasma Doping of Non-Planar Silicon Structures", Applied Physics letters, vol. 105, 2014, pp. 262102-1-262102-5 with cover page.
Combined Chinese Office Action and Search Report dated Mar. 3, 2016 in Chinese Patent Application No. 201380054482.2 (with English translation), citing documents AG through AK and AR through AT therein, 12 pages.
International Search Report and Written Opinion dated Mar. 19, 2014 in PCT/US2013/65378, citing documents AI, AK, and BA therein, 22 pages.
White, D.A., "Multivariate Analysis of Spectral Measurements for the Characterization of Semiconductor Processes", Dissertation presented Apr. 2002, at Massachusetts Institute of Technology, pp. 1-357.
Goodlin, B.E., "Multivariate Endpoint Detection of Plasma Etching Processes", Dissertation presented Apr. 2002, at Massachusetts Institute of Technology, pp. 1-226.
Combined Taiwanese Office Action and Search Report dated May 25, 2015 in Taiwanese Patent Application No. 102137525 (with English translation), citing documents AI, AK and BA therein, 19 pages.
Yue, H.H., et al., "Plasma Etching Endpoint Detection Using Multiple Wavelengths for Small Open-Area Wafers", J. Vac. Sci. Technol. A, vol. 19 No. 1, 2001, pp. 66-75 with cover page.
White, D., et al., "Low-Open Area Endpoint Detection using a PCA based $T^2$ Statistic and Q Statistic on Optical Emission Spectroscopy Measurements", IEEE Transactions on Semiconductor Manufacturing, vol. 13 No. 2, May 2000, pp. 1-30.
Goodlin, B. E., et al., "Quantitative Analysis and Comparison of Endpoint Detection Based on Multiple Wavelength Analysis", $201^{st}$ Meeting of the Electrochemical Society, International Symposium on Plasma Processing XIV, Abs. 415, May 2002, pp. 1-30.
International Search Report and Written Opinion of the International Searching Authority dated Jan. 31, 2017 in PCT/US2016/062017 filed Nov. 15, 2016.
Master's Thesis of Jae-Wook Lee, presented at University of California, Berkeley, on Jul. 1, 2000.
Shannon, et al., "A spatially resolved optical emission sensor for plasma etch monitoring", Appl. Phys. Lett., vol. 71, No. 11, 1997, pp. 1467-1468.
Excerpt from Gary Selwyn, "Optical Diagnostic Techniques for Plasma Processing", AVS Press, 1993, Relevant Chapter 3 on Optical Emission Spectroscopy (OES) is provided, along with title and bibliographic information pages.
International Patent Application No. PCT-US2014/063565, "International Search Report and Written Opinion," dated Jan. 29, 2015, International Filing Date Oct. 31, 2014.

(56) References Cited

OTHER PUBLICATIONS

Combined Office Action and Search Report dated Jan. 2, 2018 in Taiwanese Patent Application No. 105137371, with English translation citing document AO therein.

* cited by examiner

ADVANCED OPTICAL SENSOR AND METHOD FOR DETECTING AN OPTICAL EVENT IN A LIGHT EMISSION SIGNAL IN A PLASMA CHAMBER

CROSS-REFERENCE TO RELATED APPLICATIONS

This application claims the benefit of priority from U.S. Provisional Application No. 62/255,573, filed Nov. 16, 2015, the entire contents of which are incorporated herein by reference.

BACKGROUND

The present disclosure relates to detecting arcing events in a plasma processing system, and, more particularly, to methods, systems, and apparatuses for detecting light emission from an arcing event.

Plasma processing systems are used to process substrates by techniques including etching, physical vapor deposition (PVD), chemical vapor deposition (CVD), ion implantation, and resist removal. Diagnostic tools are often used to monitor a state of the plasma in order to understand and minimize defects to substrates during the manufacturing process. One source of defects during plasma processing is related to arcing events. Arcing can cause material degradation of a wafer being processed, including undesirable sputtering of the substrate material, and can also cause damage to the plasma processing system itself. Other abnormal characteristics of the plasma can cause defects or lower yield of production devices.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY

An aspect of the present disclosure includes a method for detection of optical events in a plasma processing system that detects at least one light emission signal in a plasma processing chamber. The at least one detected light emission signal includes light emissions from an optical event. The method processes the at least one light emission signal and detects a signature of the optical event from the processed light emission signal.

Another aspect of the present disclosure includes an apparatus for detection of optical events in a plasma processing system. The apparatus includes a window disposed on a plasma processing chamber of the plasma processing system, for providing optical access to the plasma processing chamber; at least one optical detector for detecting light emission signal from an optical event in the plasma processing chamber via a light collector; and a controller. The controller is configured to process the light emission signal based on an operation status of the plasma, and detect a signature of the optical event from the at processed light emission signal.

Another aspect of the present disclosure includes a system for plasma processing. The system includes a plasma processing chamber; at least one optical detector for detecting light emission signal from an optical event in the plasma processing chamber via a light collector; and a controller. The controller is configured to process the light emission signal based on an operation status of the plasma, and detect a signature of the optical event from the at processed light emission signal.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
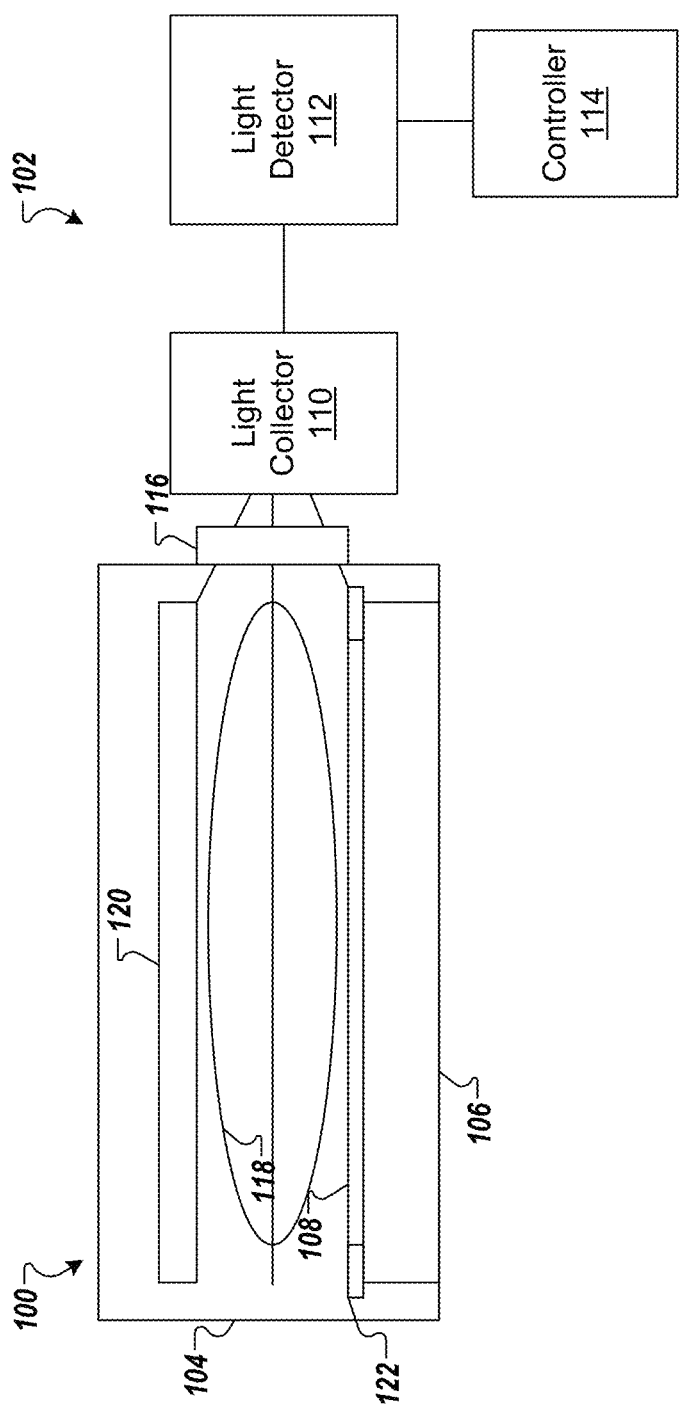
FIG. 1 is side view schematic of a plasma processing system equipped with an arcing detection system according to one example.

Referring now to the drawings, wherein like reference numerals designate identical or corresponding parts throughout several views, the following description relates to a system, sensor, and associated methodology for arcing detection.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

FIG. 1 is a side view schematic of a plasma processing system 100 equipped with an optical detection system 102 according to one example. The plasma processing system 100 includes a plasma processing chamber 104, inside which a substrate holder 106 is disposed, such as an electrostatic chuck, for receiving a substrate 108 (e.g., semiconductor wafer, integrated circuit, a sheet of a polymer material to be coated, a metal to be surface hardened by ion implantation, or other semiconductor material to be etched or deposited) to be processed. RF and/or microwave power from an RF and/or microwave source (not shown) is supplied to the plasma processing chamber 104 to ignite and sustain a plasma proximate to the substrate 108, wherein the energetic chemical species from the plasma are used to perform a plasma processing step on the substrate 108.

In one implementation, the plasma processing system 100 may utilize a pulsed plasma during operation such as in atomic layer deposition (ALD) and atomic layer etching (ALE). Processing gases (e.g., nitrogen, xenon, argon, carbon tetrafluoride ($CF_4$), or octafluorocyclobutane ($C_4F_8$) for fluocarbon chemistries, chlorine ($Cl_2$), hydrogen bromide (HBr), or oxygen ($O_2$)) are flown into the plasma processing chamber 104 and a pumping system is provided (not shown) to maintain a vacuum in the plasma processing chamber 104, at a desired process pressure. Examples of plasma processing steps include plasma-enhanced chemical vapor deposition (PECVD), plasma-enhanced atomic layer deposition (PEALD), and the like.

In one implementation, the energy source is an antenna 120 powered by an RF source to inductively couple RF energy into the plasma processing chamber 104. An electromagnetic field generated by the application of RF power to the antenna 120 energizes the process gas to form the plasma above the substrate 108.

Figure 7:
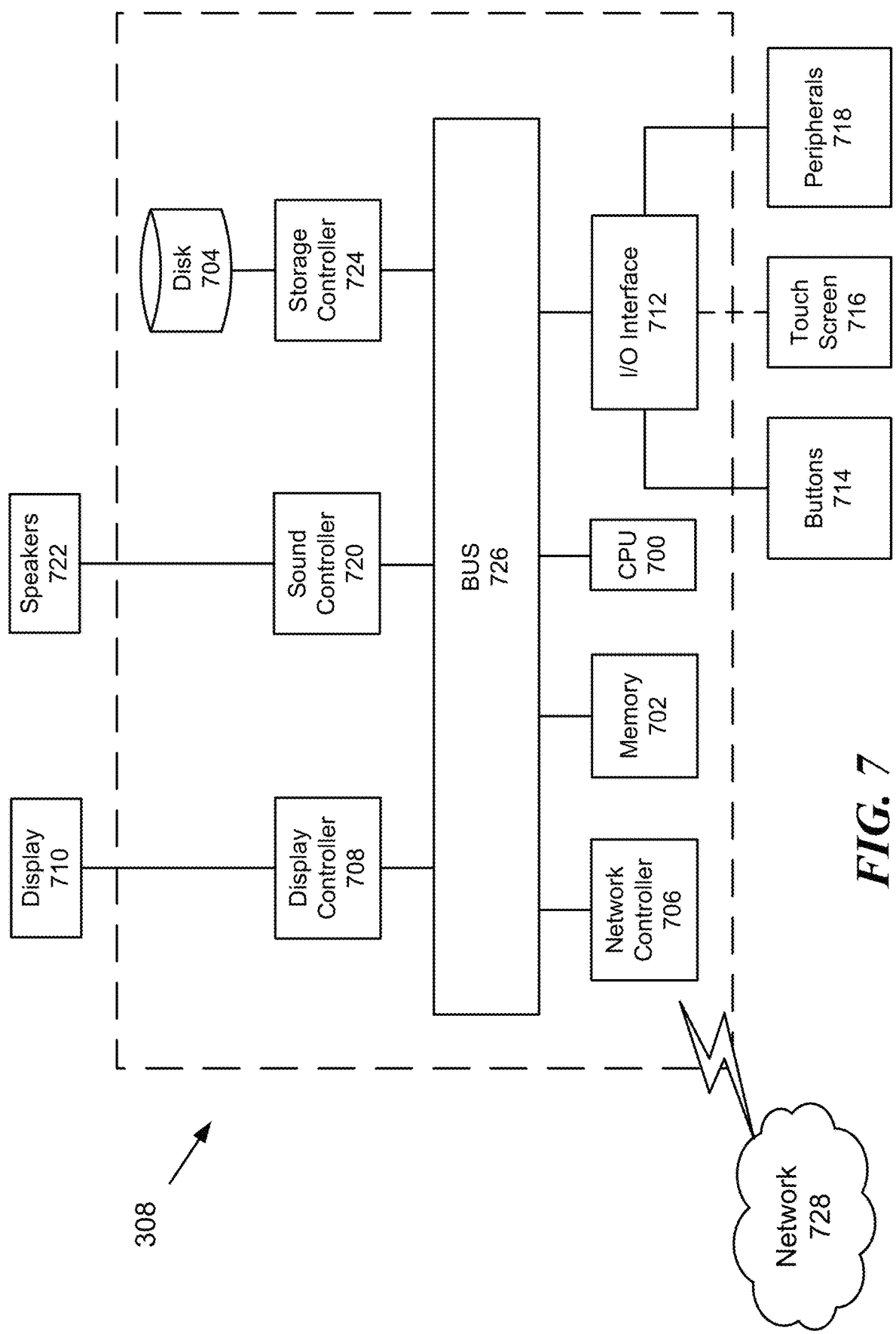
FIG. 7 is an exemplary block diagram of a computer according to one example.

The optical detection system 102 is used to detect optical events in the plasma processing chamber 104 via at least a light collector 110 and at least one optical detector 112, which communicates the detected light to and is controlled by a controller 114. The controller 114 may be a general purpose computer, as shown in FIG. 7.

Optical access to the plasma processing chamber 104 is provided by an optical window 116. The optical window 116 can include a material that is transparent in the monitored spectrum (e.g., visible) such as glass, quartz, fused silica or sapphire depending on the application and how aggressive the chemistry of the plasma. Detection area 118 defines the portion of space from which the light emission is collected. The plasma processing chamber 104 may include additional windows. For example, a second window may be used for a conventional optical emission spectroscopy system used for process end-point detector (EPD), for example. Alternatively, the light collector 110 may be positioned in other positions as well, the plasma processing chamber 104 depending on the location of the plasma to be monitored for optical events. For example, the light collector 110 may be positioned to detect arcing during pin-up (lifting of the substrate 108 from the substrate holder 106).

As noted above, arcing can cause material degradation of a wafer being processed and/or damage to the plasma processing system itself. Specific conditions may lead to abnormal discharge (arc) in the plasma processing chamber 104. The abnormal discharge may release acoustic, RF, chemical, and light energy. By detecting one or more of these energies (signals), it is possible to detect the arc as an abnormal discharge. For example, it is generally known that some arcing events within the plasma processing chamber 104 can be observed by disruption of RF coupling to process gases within the plasma processing chamber 104 (i.e. impedance mismatch). The present inventor determined through testing, for example, that RF and acoustic techniques for detecting of abnormal plasma discharge events such as arcing are inadequate for detecting and characterizing many abnormal plasma conditions in the plasma processing chamber 104.

The sensor, system, and associated methodologies described herein detect optical signals associated with arcing events inside the plasma processing chamber 104. The sensor described herein detects arcs over a large volume of the plasma processing chamber 104 including a horizontal dimension covering the substrate surface, and a vertical dimension covering the plasma itself from the substrate 108 to the upper electrode, for example. In one embodiment, the optical detection system 102 can detect arcs on the surface of a wafer, a focus ring, an antenna (i.e., electrode of capacitive-coupled RF plasma chamber), and inside the plasma itself. Optical detection of arcs is achieved even when very bright background light from the normal plasma process is present and/or when no plasma is present.

Figure 2A:
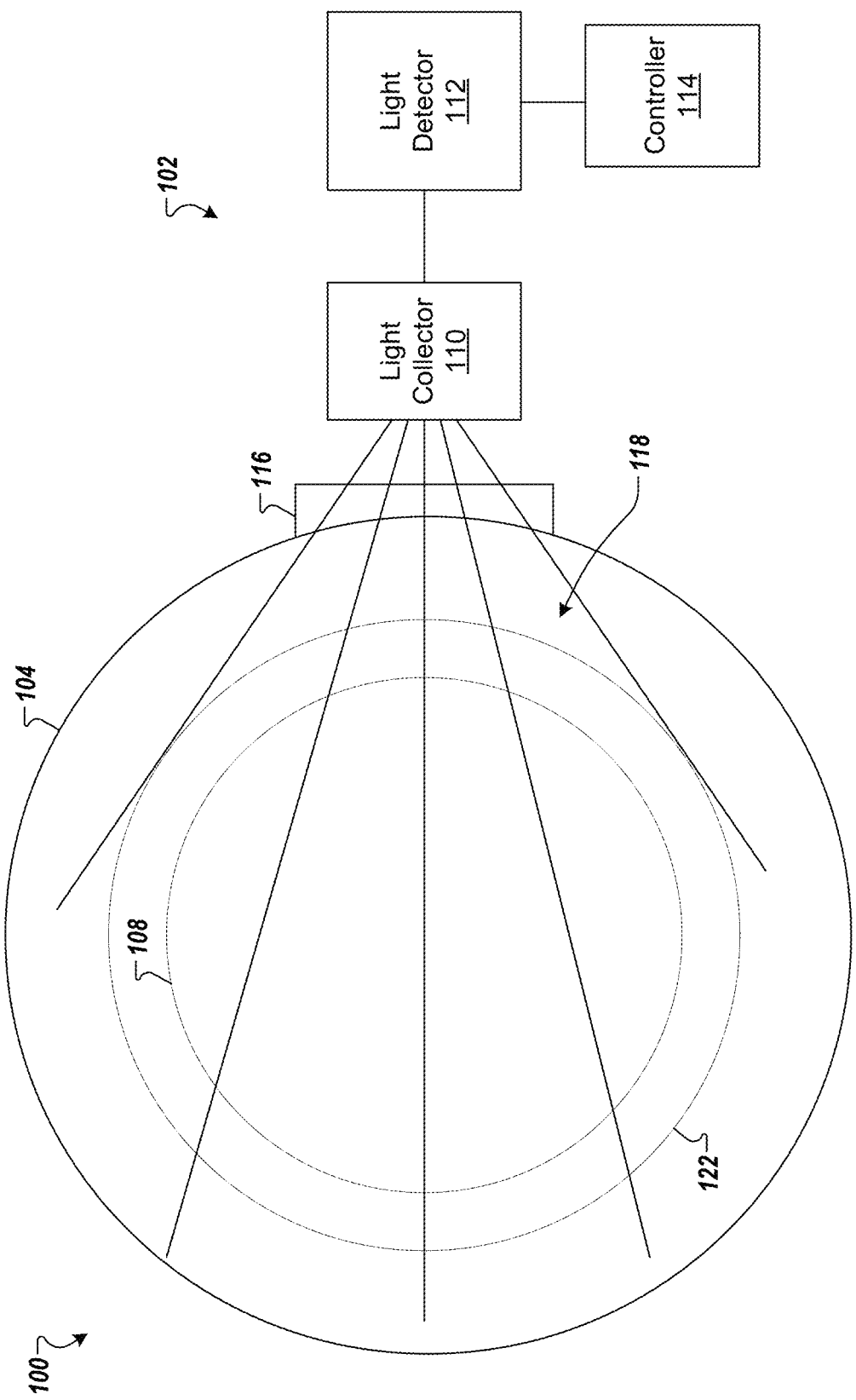
FIG. 2A is a top view schematic of the plasma processing system equipped with the arcing detection system according to one example.

FIG. 2A is a top view schematic of the plasma processing system 100 equipped with the optical detection system 102 according to one example. The light collector 110 includes multiple optical paths covering a large portion of the plasma processing chamber 104 volume and the surface of the substrate 108, a focus ring 122, and the antenna 120 (detection area 118). In one embodiment, this is achieved by wide angle lenses. For example, six wide angle lenses may be positioned adjacent to one another such that their fields of view overlap to collectively cover the desired volume of the plasma processing chamber 104.

The light detector 112 receives the detected light from the light collector 110 directly or via one or more optical fibers. One or more optical detectors may be used.

The background light (i.e. light which is not indicative of an optical event) to optical detector has power in the range from a few microwatts to hundreds of microwatts. The background light can saturate the light detector 112. The light from a typical arc itself is in range from [pW] (picowatt) to [µW] (microwatt). Thus, the detector is equipped with software controlled gain and background subtraction for elimination of the background light signal. An exemplary light detector 112 with background light subtraction is shown in FIG. 3B discussed below. Thus, the light detector 112 may detect arcing events having an optical signal with a power of at least 3 orders of magnitude lower than the power of the optical signal of the plasma light emission. The light detector 112 provides a high gain for arc signals even when the intensity of the light from plasma is very high.

The duration of the arc is in the range of a few microseconds to hundred milliseconds. The optical detector electronics and acquisition system (e.g., the controller 114) are very fast to handle the signal from the arc in the microsecond range (e.g., 10 µs or lower). The electronics, firmware, and software can handle a real time detection of the arc and provide time stamp information when the arc happens as well as the amplitude and duration of the arc with a very high resolution. Thus, arc detection may be performed within the typical pulse duration of a pulsed plasma.

The optical detection system 102 can detect light pulses starting from the hundred nanosecond range when the optical pulse energy (i.e., duration of the pulse multiplied by the power of the pulse) is in the pJ range. The light detector 112 detects light pulse energy in addition to the light intensity. In one implementation, the electrical signal from the light detector 112 is proportional to the amplitude of a light pulse when the light pulse has a duration greater than 6 microseconds. Further, the light detector 112 can detect light pulses having a duration lower than 0.5 microseconds when the pulse light energy is greater than 0.1 pJ.

Figure 2B:
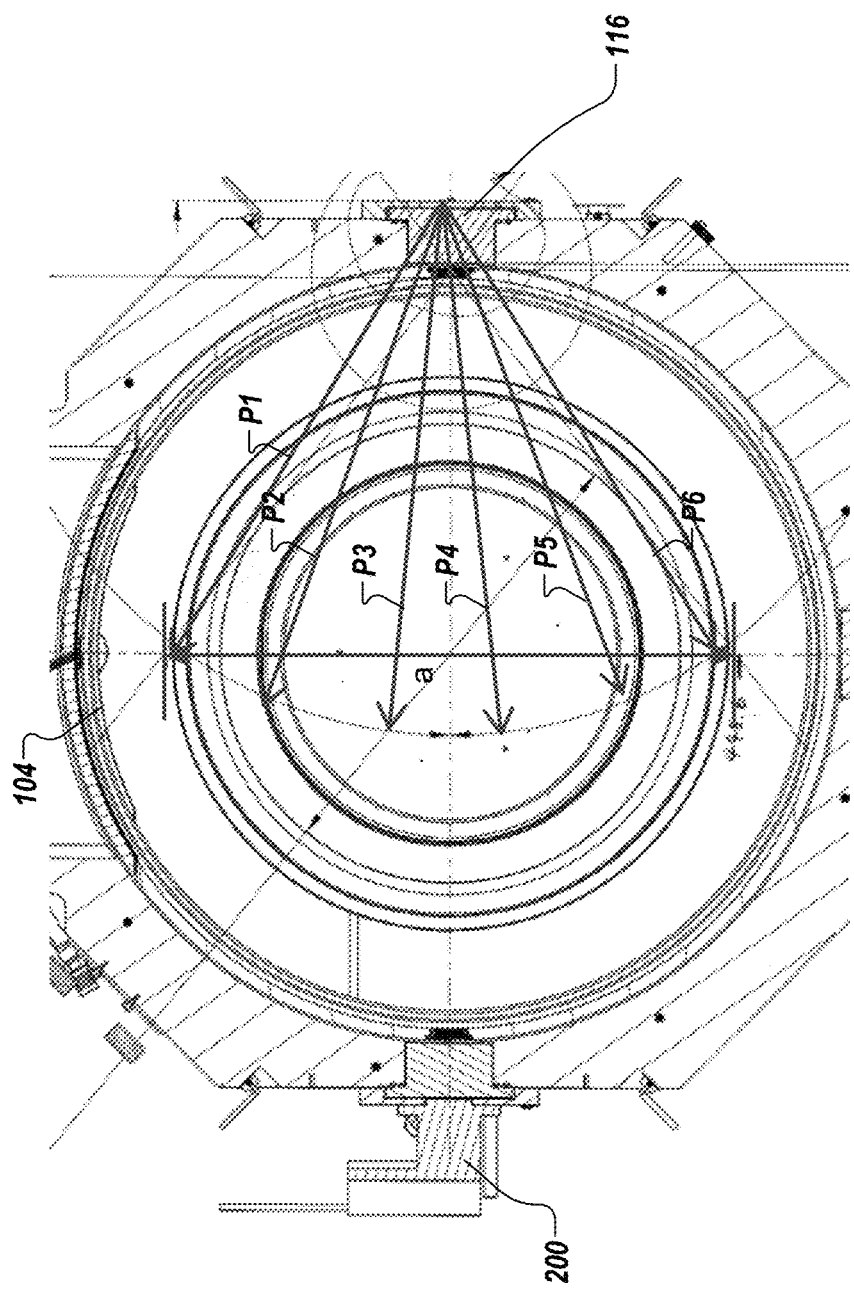
FIG. 2B is a top view schematic of the plasma processing system equipped with the arcing detection system according to one example.

FIG. 2B is a top view schematic of the plasma processing system 100 equipped with the arcing detection system 102 according to one example. As described previously herein, the plasma processing system 100 may be equipped with multiple windows. For example, in addition to the optical window 116, the plasma processing system 100 may include a second window 200 for OES (optical emission spectroscopy) endpoint detection. In one example, the detection area diameter a is 450 mm at the wafer center.

Figure 3A:
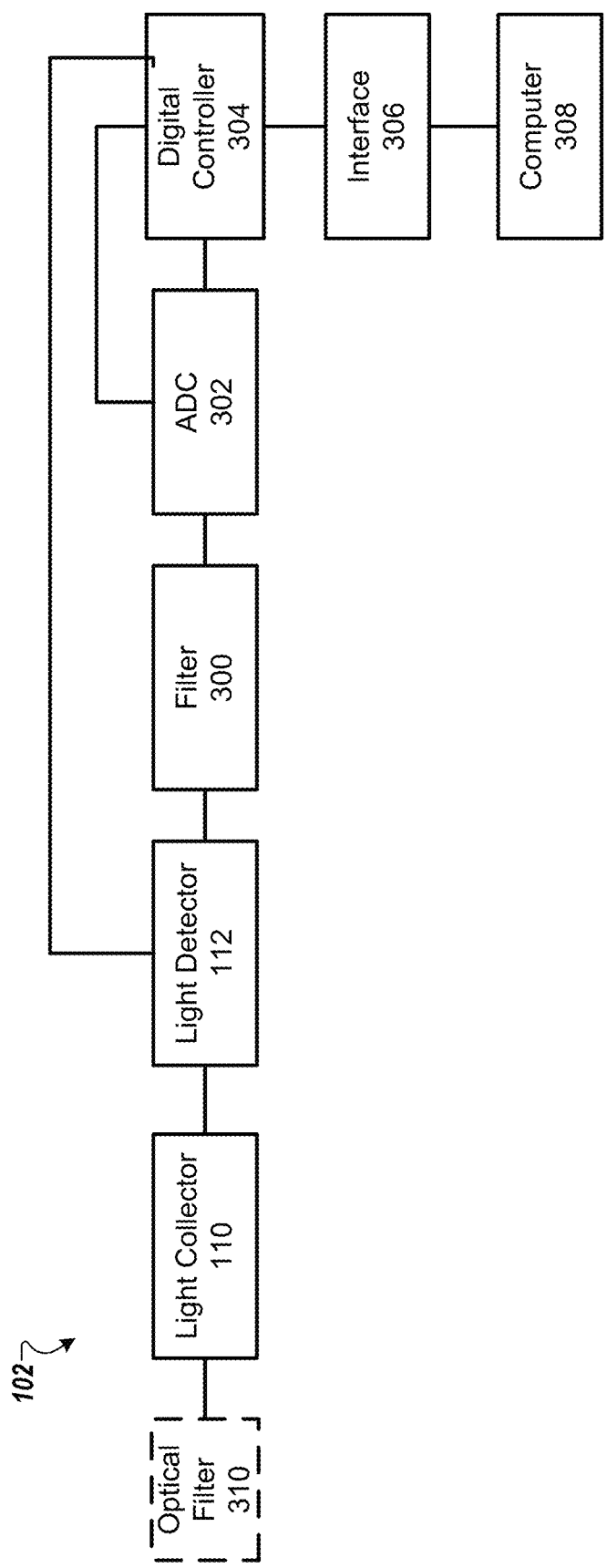
FIG. 3A is an exemplary block diagram of the arcing detection system according to one example.
Figure 3B:
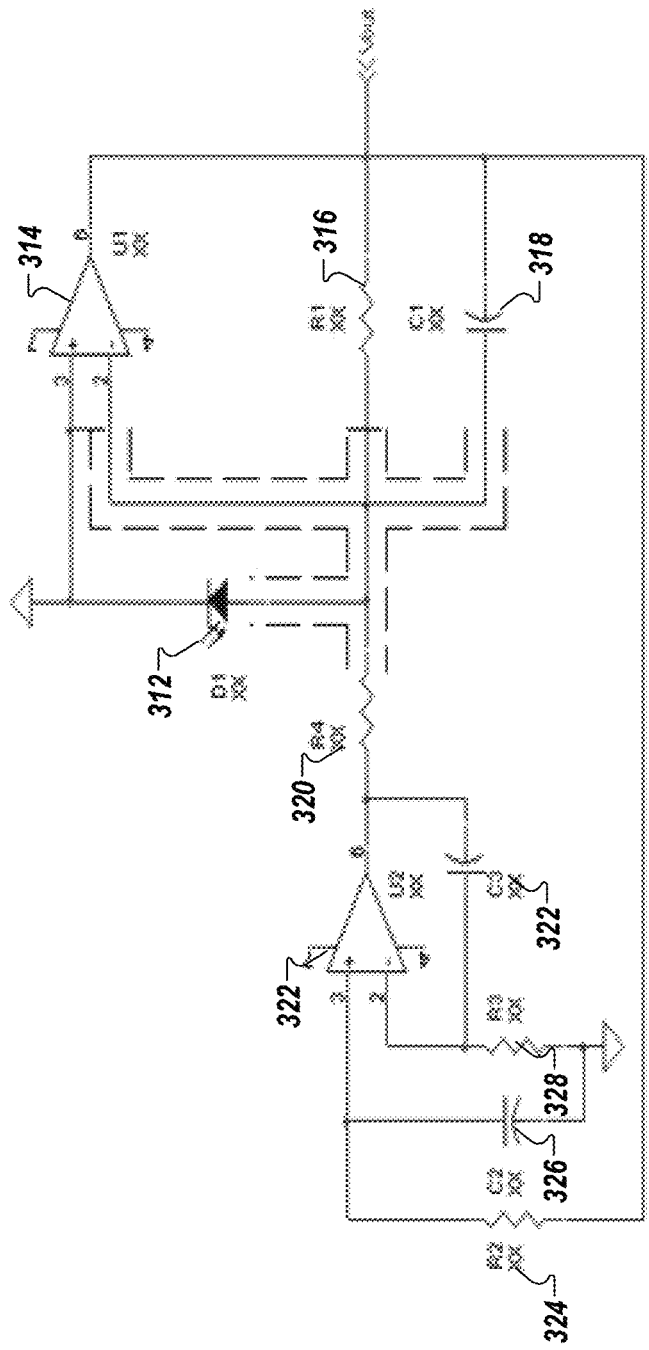
FIG. 3B is an exemplary block diagram of a light detector according to one example.

Turning to FIG. 3A, the optical detection system 102 for arcing detection is shown according to one embodiment. The optical detection system 102 may include the light collector 110, the light detector 112, a filter 300, an ADC 302 (Analog to digital convertor), a digital controller 304, an interface 306, a computer 308, and an optional optical filter 310.

The optical detection system 102 is located outside the plasma processing chamber 104 such that light passes through the optical window 116 of the plasma processing chamber 104. Light emitted in the plasma processing chamber 104 is collected by the light collector 110, and is passed to the light detector 112 via an optical fiber (not shown) for example. Then, the detected intensities may be filtered via the filter 300 (e.g., an electronic analog filter). The filtered intensities are then fed to the digital controller 304 via the ADC 302. The digital controller 304 passes the detected intensities to a computer 308 via the interface 306. The digital controller 304 controls the light detector 112 and the ADC 302. The arcing events are in the micro-second order, thus the digital controller 304 has a fast response time. Note that the resolution of the ADC 302 controls the time resolution of the optical detection system 102. However, the ADC 302 does not control the time resolution of the light pulse detected via the light detector 112.

The computer 308 may be located proximate to the plasma processing system 100, or may be located remotely, and connected via a network (e.g., internet, intranet) to the system.

The light collector 110 is configured to detect light emission from any point in an area covering the substrate 108 and the focus ring 122 (e.g., detection area 118 of FIG. 1). In the vertical direction, the light collector 110 is configured to detect any arc from the wafer to the antenna 120 as shown in FIG. 1. The light collector 110 may include one or more lens. The one or more lens may have a focal length (f) and f number (N) as a function of the detection area 118 dimensions. For example, the light collector 110 may include one or more wide angle lens.

In one implementation, the one or more lenses may be positioned at different angles to cover detection area 118. In one example, the detection area diameter is 450 mm at the center of the plasma processing chamber 104 as shown in FIG. 2B. The light collector 110 may include six lenses each positioned at an angle of −31.1, −19.7, −6.1, 6.1, 19.7, and 31.1 degree, respectively. In order to cover 450 mm at wafer center with 6 lenses, each lens has an object size of 75 mm or larger (i.e., 450 mm/6=75 mm). The light collected by each lens is transmitted to the light detector 112 by an optical fiber. In one implementation, 800 µm fiber is used. Thus, the image size is 0.8 mm. In one example, the lens may be positioned at a distance of 375 mm from the wafer center and have an aperture of 4.8 mm. Thus, the object space NA (Numerical Aperture) is 0.0064 (~D/2f=4.8/750) and the image space numerical aperture is 0.44. With this configuration, there is no gap between each channel at the wafer center, but there is a maximum gap of 3 mm at the wafer edge, which leads to a small drop in efficiency. The ray trace at the center of each channel is shown by P1, P2, P3, P4, P5, and P6 in FIG. 2B.

The light detector 112 may include a photomultiplier tube, CCD (Charged-coupled device), a photodiode, a CMOS (Complementary metal-oxide-semiconductor) photo array, a photodiode array. In one implementation, the light detector 112 has a readout frequency of 5 MHz or higher. The light detector 112 is configured to detect in the wavelength range 400 nm-900 nm. In one implementation, the light detector 112 may have specific wavelength spectral characteristic based on application requirements. For example, the photodiode may include an optical filter configured for a specific wavelength. The light detector 112 may have a variable gain controlled by the digital controller 304. For example, the light detector 112 may be implemented by a variable gain photodiode controlled by the digital controller 304.

The light detector 112 may include one or more light detectors. Each of the detectors/subareas of the detector may cover overlapping areas of the detection area 118 covering the wafer and the focus ring. Each signal emitted in by a subdetector outputs to a channel.

In one implementation, the optical detection system 102 may further include one or more optical filters in the optical path (e.g., optical filter 310). For example, a spectral filter may be included in front of the photodiode associated with a channel. The channel represents an output associated with a part of the detection area 118. In one implementation, the optical detection system 102 includes six channels. Further, multiple filters may be used to provide high spectral (wavelength resolution). This provides an ultra-high speed sensor with discrete spectral information. The optical filters may be included in all channels or fewer channels. The optical filter 310 may be used to optically suppress background light signal. For example, a filter may be used to block a 700 nm signal associated with Ar in the plasma.

In one implementation, each optical fiber (from the light collector 110) may be split into multiple discrete spectral channels via optical spectral splitters (e.g., optical filters with beam splitters). For example, two or three spectral line-channels can be obtained from one channel.

The spectral information may be used for monitoring the plasma processing chamber and for the diagnostic of faults in the plasma processing chamber 104. For example, the optical detection system 102 may detect helium gas leakage in the plasma processing chamber 104 from under the substrate 108 during plasma ramp down. Further, the optical detection system 102 may detect discrete gas emission line during etching as well as sporadic events.

A sparking event may be detected by one or more channels. Large arcing may appear in all the channels at the same time with a same shape, and similar signal strength. Small arcing may have noticeable difference between channels, thus providing spatial location of the arc within the plasma processing chamber 104.

The optical detection system 102 detects arcing from wafer chucking to wafer de-chucking (plasma off). Arcing events during de-chucking may be caused by residual charges.

In one implementation, the light detector 112 and an end-point detector sensor (not shown) may be collected in one housing. The light detector 112 and the end-point detector sensor may communicate with the computer 308 via communication cables. The computer 308 may also detect and process a plasma optical emission spectroscopy (OES) signal.

FIG. 3B is an exemplary block diagram of a light detector 112 according to one example. In one implementation, the light detector 112 may include a background light subtraction circuit to avoid saturation of the detector. The light detector 112 may include a photodiode 312, a resistor 316, a capacitor 318, and an IC Op Amp (Integrated circuit operational amplifier) 314 (e.g., a high gain op amp). The background light subtraction circuit includes an IC Op Amp 322, resistors 320, 324, and 328, and capacitors 322 and 326. The background light subtraction circuit generates a current proportional to the background light and is not sensitive to a short light pulse. The current from resistor 320 is subtracted from the photodiode current and thus the Op Amp 314 is not saturated by the background light. The current from resistor 320 is proportional to the background light.

Figure 4:
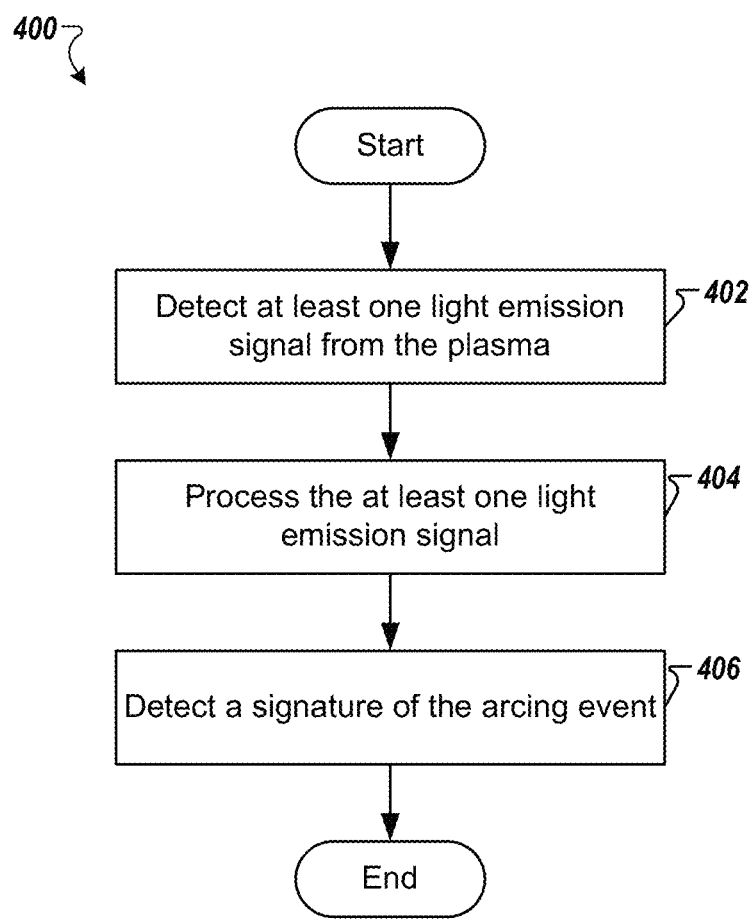
FIG. 4 is a flowchart that shows a method for arcing detection according to one example.

FIG. 4 is a flowchart that shows a method 400 for arcing detection according to one example. The method 400, for example, may be performed by the controller 114 described in relation to FIG. 1. In some implementations, the method 400 may begin when the PECVD chamber is activated.

At 402, a light emission signal may be detected. For example, the light detector 112 may detect a light signal received via the light collector 110.

At 404, the light emission signal is processed. In some implementations, when the plasma light emission is on, the plasma light emission is subtracted from the detected light emission signal. In some implementations, when the plasma light emission is off (e.g., during wafer de-chucking), a background noise may be subtracted. The background noise represents electronics noise or other noises that may cause fluctuations in the detected signals that are not due to the background light or optical events.

In some implementations, the detected light intensity may be processed as a function of an average noise. For example, the emission to the light collector 110 may be blocked and a background noise is detected and saved. The background noise may be collected when the plasma is off and/or on. Then, the background noise may be subtracted from the detected light intensity.

In some implementations, the background light is suppressed using one or more techniques based on the process. For example, one or more of optical filtering, light detector gain control and ADC control may be used to achieve optimal suppression of the background plasma light signal and to achieve high signal to noise ratio for optical emissions that indicate plasma anomalies.

At 406, a signature of the arcing event from the processed light emission signal is detected. In some implementations, the arching event is detected when the processed light emission signal is above a threshold value.

Further, the arcing event may be classified based on the detected intensities. For example, small arcing events may include arcing events having intensities between the threshold value and a second threshold value. Strong arcing events may include arcing events having intensities greater than the second threshold value.

In one embodiment, once an arcing event has been detected, a warning signal may be generated such as an audio warming, visual warning to take corrective action to minimize substrate arcing or to terminate plasma processing.

In one embodiment, the arcing events may also be simultaneously detected via other arcing detection techniques such as via an acoustic emission sensor (AE), a RF probe, and/or an OES system. Data collected may be used for cross checking and further identifying an arcing event detected.

Software algorithms may be used in the detection and characterization of optical events. In one example, an algorithm may learn normal signal patterns of a recipe at each step. Then, a signal pattern comparison algorithm is applied during measurement runs with the "learned" normal pattern to detect abnormal signals. The algorithm may be used for arcing detection as well as for plasma monitoring.

A machine learning algorithm, or a trained model (e.g., with dimensional reduction) may be used to discriminate between an abnormal signal (e.g., arc, unstable plasma) and a normal signal (i.e., signal after all filtering applied such optical, electrical filters or the like). Specific artificial intelligence algorithms may be dependent on the individual actual plasma process application (for example, etch runs). A trained model of signal pattern recognition may be used for identification of unusual signals from normal signals under many different scenarios (e.g., spike detection).

Figure 5:
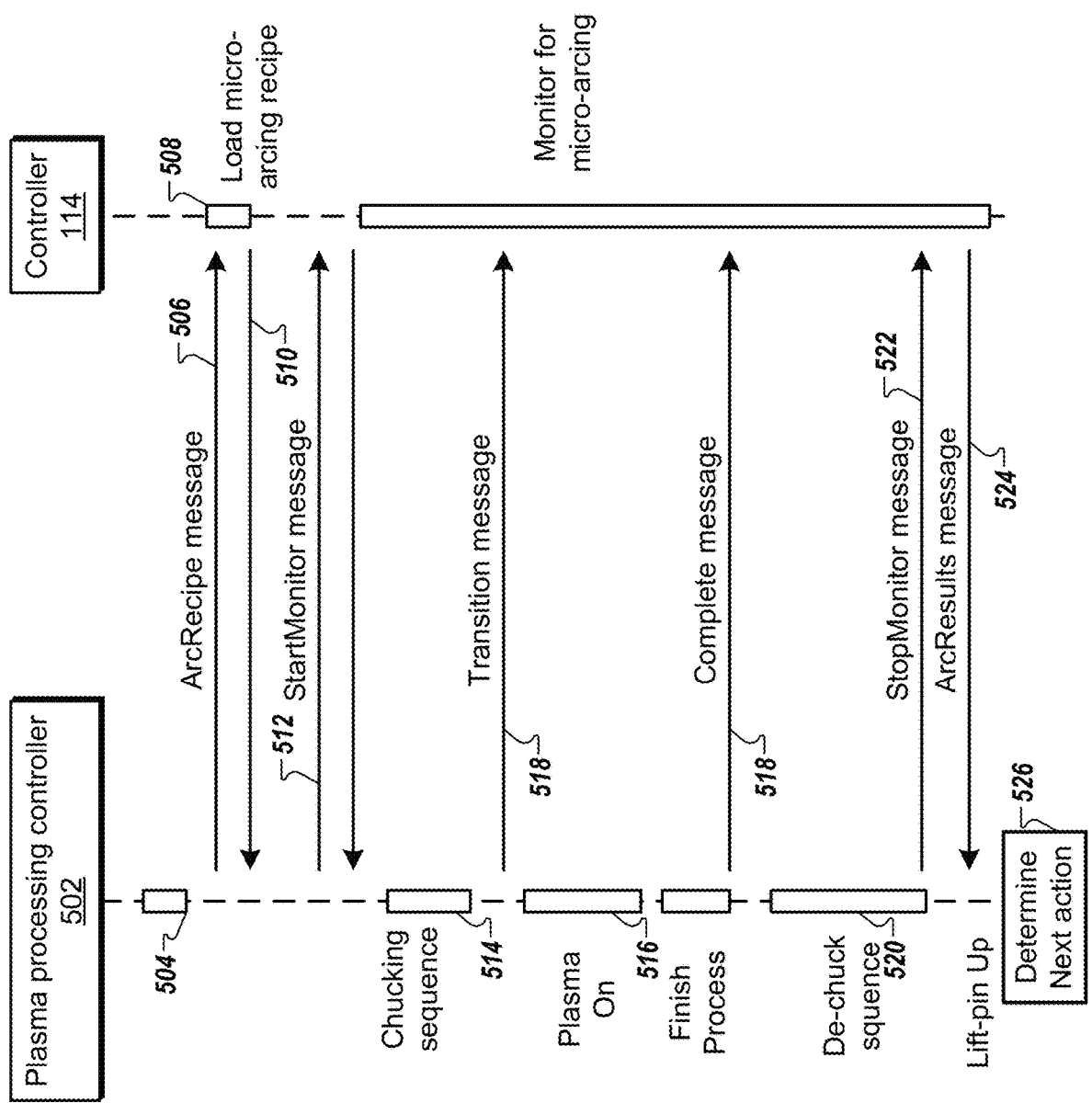
FIG. 5 is a flowchart that shows a method for monitoring arcing events according to one example.

FIG. 5 is a flowchart that shows a method 500 for arcing detection according to one example. A substrate (e.g., substrate 108) is disposed on a substrate holder (e.g., substrate holder 106) in the plasma processing system 100 (504). The plasma processing controller 502 may send a message to the controller 114 (506) including information about the wafer load being processed. Then, the controller 114 may load information associated with the wafer load being processed for example, light plasma intensity associated with the current load (508). The controller 114 may send an acknowledgment message (510). Then, the plasma processing controller 502 may send a message to the controller 114 to start the arcing monitoring process (512), for example, method 400 shown in FIG. 4. Then, a chucking sequence is started (514). A chucking force is applied to the substrate (514). Once the chucking sequence is completed, the plasma is turned on (516) and a transition message indicating that the plasma is ON is sent to the controller 114 (518). Once the plasma process is completed and the plasma is turned off, a complete message is sent to the controller 114. The controller 114 may adjust the processing of the detected light intensities. For example, the controller 114 may filter the detected light intensities as a function of the background noise.

In response to determining that the process has ended, a de-chuck sequence may be started (520). During the de-chuck sequence, the chucking force is removed from the substrate 108. As described previously herein, during the de-chuck sequence the plasma processing chamber 104 is monitored for arcing events. Once the de-chuck sequence is completed, the plasma processing controller 502 may send a stop monitor message to the controller 114 (522). The controller 114 may send to the plasma processing controller 502 the monitoring results (524). The monitoring results may include information (e.g., intensity, timestamp, time span) about one or more arcing events detected. Upon receiving the monitoring results, the plasma processing controller 502 may determine a "next" action (526) based on the severity of the arcing events detected. The "next" action may include outputting a flag to an operator, logging the wafer as a defect, performing a maintenance routine, or the like.

In some embodiments, the optical detection system 102 may detect optical events other than arcing. For example, the optical detection system 102 may detect abnormal emission spikes (e.g., negative spikes) and/or unusual plasma emission occurrence (e.g., dips, extinguishing, flickering, or the like). The detected signals may be analyzed to determine a correlation between recipe, chamber conditions, and/or parts of the chamber/wafer with the unusual or abnormal emissions.

The optical detection system 102 provides the user with user interfaces. For example, a first user interface may be for data acquisition and a second interface may be for data analysis.

Figure 6A:
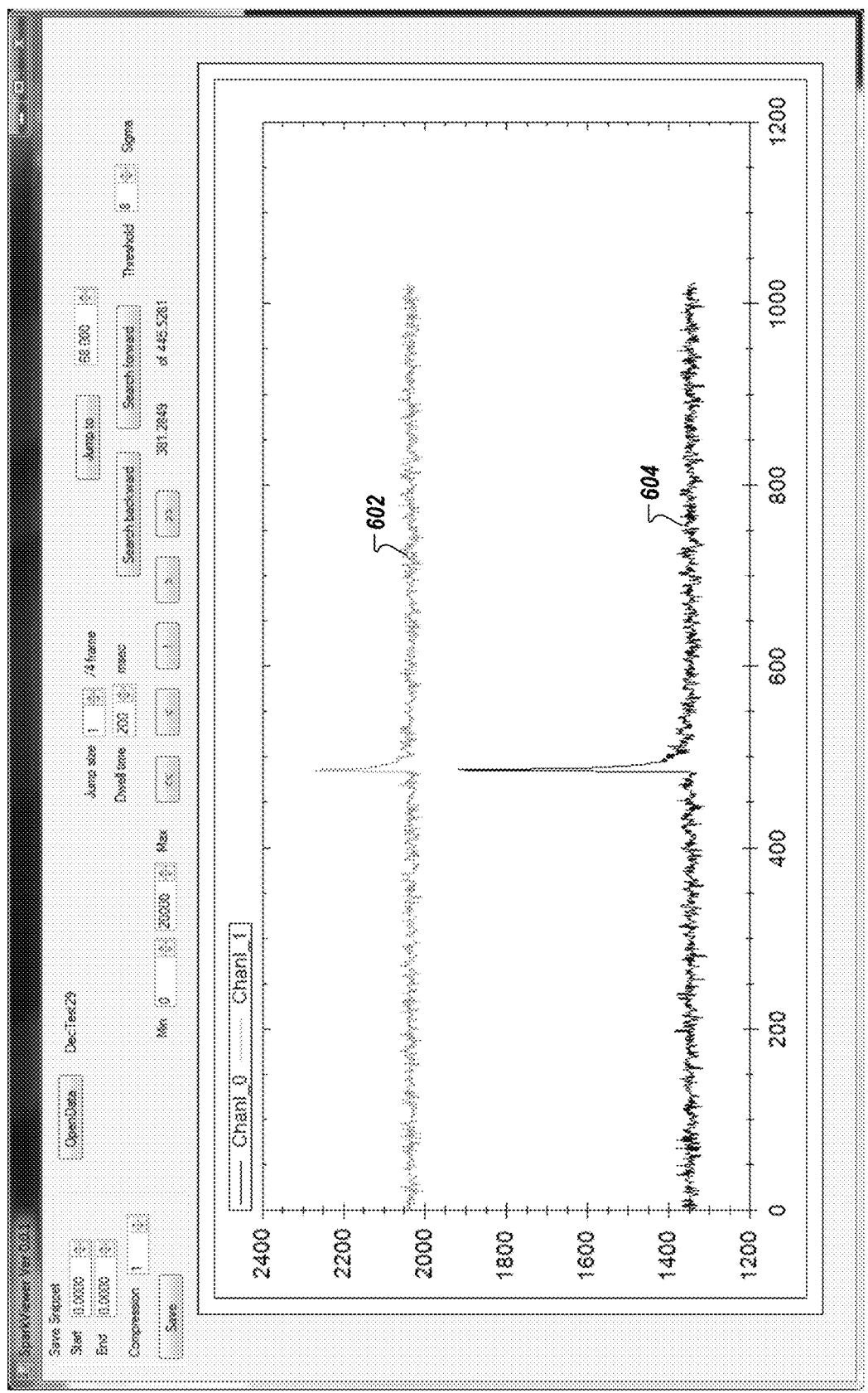
FIG. 6A is an exemplary arcing intensity signal acquired using the arcing detection system.

FIG. 6A is an exemplary arcing intensity signal acquired using the arcing detection system. Schematic 600 shows a user interface that shows exemplary results. Traces 602 and 604 show an arcing event detected by two channels. To simulate an arcing event during plasma processing, a Kapton tape and a test chip with a TiN conductor layer are used. Both edge arcing and surface arcing is generated using the kapton tape. The plasma is generated using a CF4/Ar source.

Figure 6B:
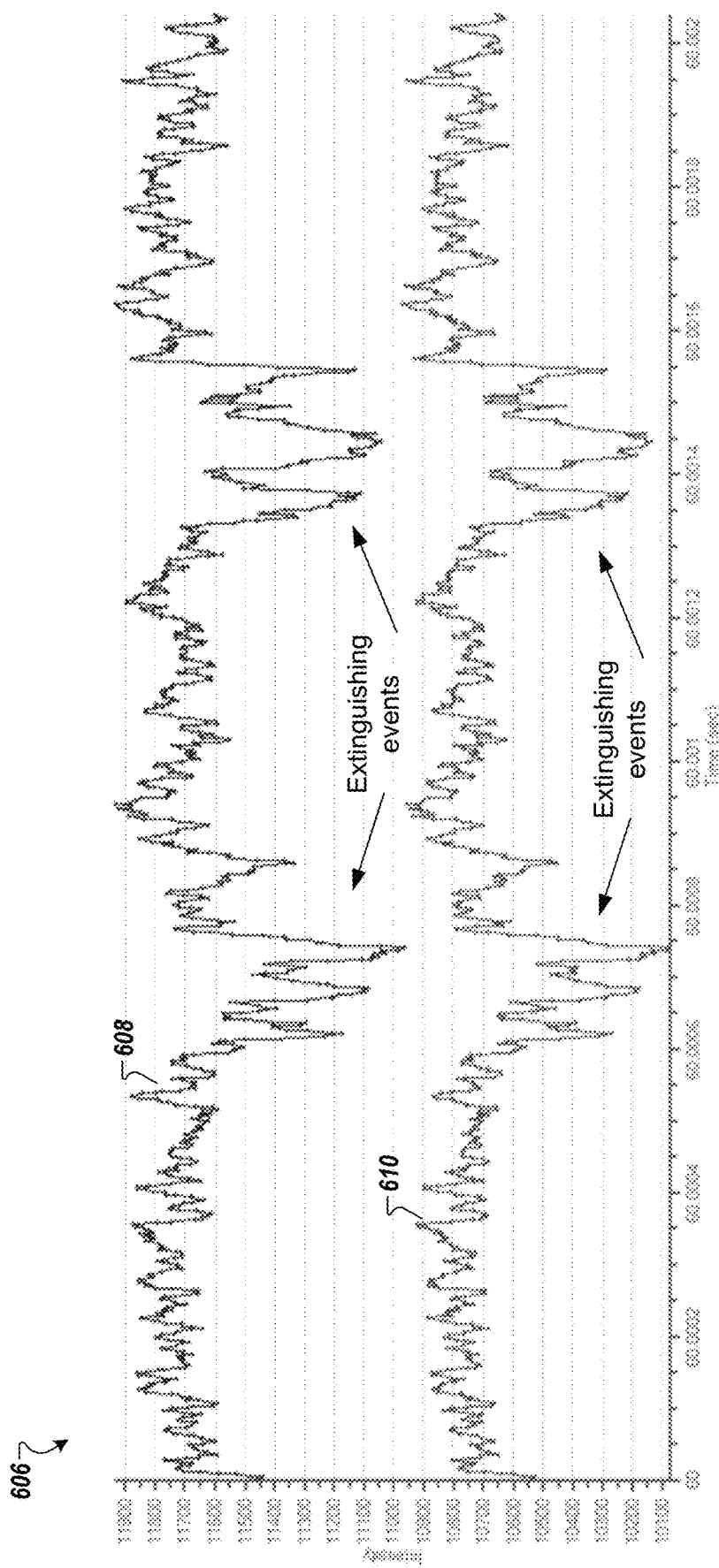
FIG. 6B is a schematic that shows the plasma intensity according to one example.

FIG. 6B is a schematic that shows the plasma intensity according to one example. Schematic 606 shows the plasma (emission) intensity in time domain. Trace 608 shows the emission intensity captured by a center channel. The center channel captures emission in the center of the plasma processing chamber 104 (e.g., P3 or P4 shown in FIG. 2B). Trace 610 shows the emission intensity captured by a side channel. As shown by trace 608 and trace 610 the plasma is not stable, about 10% fluctuation in emission intensity is observed in time domain. The high resolution of the optical detection system 102 gives more information about the stability of the plasma. In addition to the arcing events, the system may detect unusual plasma emission occurrence (e.g., dips, extinguishing, flickering). Trace 608 and trace 610 shows two extinguishing events. The extinguishing events represent dips in the plasma intensity that may occur in an unstable plasma.

Figure 6C:
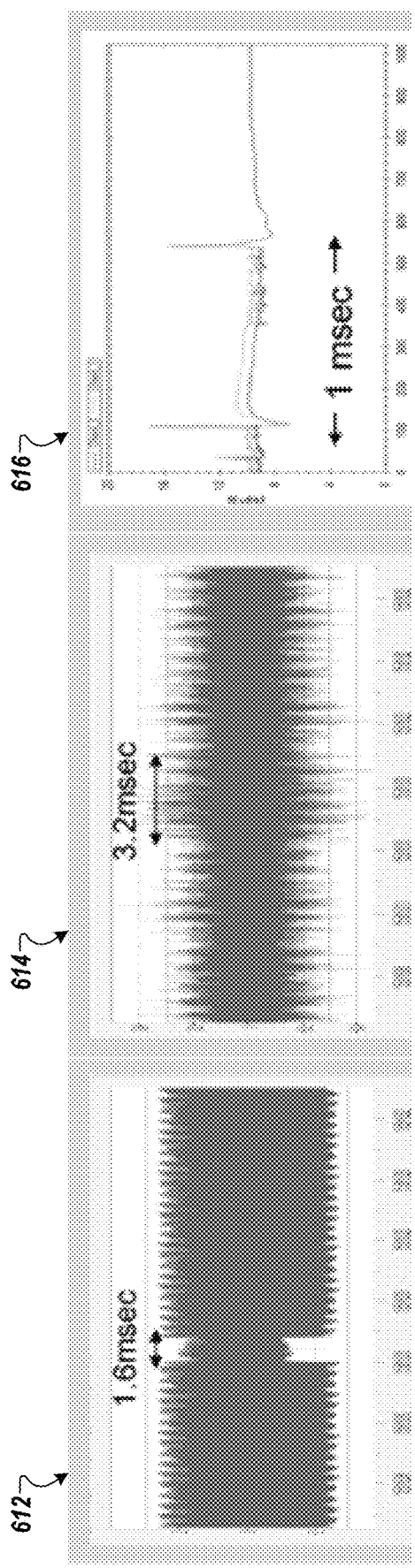
FIG. 6C is a schematic that shows exemplary results.

FIG. 6C is a schematic that shows exemplary results. Schematic 612 shows the arcing event detected using an RF probe. Schematic 614 shows the same arcing event detected via an AE sensor. Schematic 616 shows the same arcing event detected by the optical detection system 102 described herein. The arcing event is detected with a higher resolution via the optical detection system 102 compared to the other techniques.

Next, a hardware description of the computer 308 according to exemplary embodiments is described with reference to FIG. 7. In FIG. 7, the computer 308 includes a CPU 700 which performs the processes described herein. The process data and instructions may be stored in memory 702. These processes and instructions may also be stored on a storage medium disk 704 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 308 communicates, such as the plasma processing system 100.

Further, the claimed advancements may be provided as a utility application, background daemon, or component of an operating system, or combination thereof, executing in conjunction with CPU 700 and an operating system such as Microsoft Windows 7, UNIX, Solaris, LINUX, Apple MAC-OS and other systems known to those skilled in the art.

In order to achieve the computer 308, the hardware elements may be realized by various circuitry elements, known to those skilled in the art. For example, CPU 700 may be a Xenon or Core processor from Intel of America or an Opteron processor from AMD of America, or may be other processor types that would be recognized by one of ordinary skill in the art. Alternatively, the CPU 700 may be implemented on an FPGA, ASIC, PLD or using discrete logic circuits, as one of ordinary skill in the art would recognize. Further, CPU 700 may be implemented as multiple processors cooperatively working in parallel to perform the instructions of the inventive processes described above.

The computer 308 in FIG. 7 also includes a network controller 706, such as an Intel Ethernet PRO network interface card from Intel Corporation of America, for interfacing with network 728. As can be appreciated, the network 728 can be a public network, such as the Internet, or a private network such as LAN or WAN network, or any combination thereof and can also include PSTN or ISDN sub-networks. The network 728 can also be wired, such as an Ethernet network, or can be wireless such as a cellular network including EDGE, 3G and 4G wireless cellular systems. The wireless network can also be WiFi, Bluetooth, or any other wireless form of communication that is known.

The computer 308 further includes a display controller 708, such as a NVIDIA GeForce GTX or Quadro graphics adaptor from NVIDIA Corporation of America for interfacing with display 710, such as a Hewlett Packard HPL2445w LCD monitor. A general purpose I/O interface 712 interfaces with a keyboard and/or mouse 714 as well as an optional touch screen panel 716 on or separate from display 710. General purpose I/O interface also connects to a variety of peripherals 718 including printers and scanners, such as an OfficeJet or DeskJet from Hewlett Packard.

A sound controller 720 is also provided in the computer 308, such as Sound Blaster X-Fi Titanium from Creative, to interface with speakers/microphone 722 thereby providing sounds and/or music. For example, audible alerts may be outputted via the speakers 722 when arcing events are detected.

The general purpose storage controller 724 connects the storage medium disk 704 with communication bus 726, which may be an ISA, EISA, VESA, PCI, or similar, for interconnecting all of the components of the computer 308. A description of the general features and functionality of the display 710, keyboard and/or mouse 714, as well as the display controller 708, storage controller 724, network controller 706, sound controller 720, and general purpose I/O interface 712 is omitted herein for brevity as these features are known.

The optical detection system 102 described herein has a higher signal to noise (S/N) (i.e., around ten time better S/N) compared to other sensors (e.g., acoustic emission (AE) sensor, RF probe, and EPD sensor). In addition, the optical detection system 102 has a better time resolution (i.e. around 100 time better time resolution) compared to known techniques (e.g., AE sensor, RF probe, and EPD). In addition, the system has the advantage of detecting "small" arc events not detected by other known sensors.

The inventors performed tests for determining the effects electromagnetic (EM) signals on the optical detection system. For example, a plasma was initiated and maintained in the plasma processing chamber 104, without any substrate and without any arcing conditions simulated in the plasma processing chamber 104. The optical detection system 102 did not detect any arcing event signal (e.g., by controller 114), indicating that the plasma under normal conditions does not generate significant EM signals that may interfere with the optical detection system 102 and its associated electronics. Tests were also performed under arcing conditions. Arcing was produced for example, by use of kapton tape to fix a test chip to the substrate holder 106. Arcing on the chip surface and at edges of the chip were visually confirmed by burn marks on the test chip and on the substrate holder 106. During these arcing events, one channel of the optical detector was optically blocked and compared to a non-blocked channel. An arcing event was detected on the non-blocked channel, while no event was detected on the optically blocked channel, indicating that any EM signals from an arcing event would not significantly affect on the optical detection electronics. Further, an EM mesh shield was provided on the optical window to block any EM signals from within the chamber. The EM shield reduced the optical signal detected, no improvement of the detected arcing signal from the shield, indicating that an EM was not essential or even needed for use of the optical detection system.

Arcs were generated in the plasma processing system 100 under varying conditions to assess the system's detection rate under varying conditions. Burn marks were used to confirm the occurrence of arcing events in the chamber. The optical detection system 102 did not detect any arcing signal when no burn marks are present. Thus, the optical system had no false positive detections. In some tests, burn marks were observed, but the system did not detect any arc event signal corresponding to the burn. This failure to detect some arcing events is thought to be attributed to certain test conditions, such as the recipe used, which can be improved by use of optical filters, detector gain control techniques, and analog signal filters to suppress the background plasma emissions and improve signal to noise ratio for the optical event.

The inventors performed tests for characterizing arcing events. Different size arcing events were simulated by use of Kapton tape and or a test chip in the chamber. The observed burn mark was proportional to the size of the arcing event. Detection of the various arcing events by the optical detector disclosed herein was compared to other detection methods (e.g., RF probe, AE sensor, and optical emission spectroscopy detection (OES)). The results showed that the RF probe, AE sensor, OES system and the inventive optical detector could detect relatively large arcs. However, the inventive optical detector detected smaller arcs that were not detected by the RF probe, AE sensor, OES systems. In addition, the optical detection system 102 has a better signal-to-noise (S/N) ratio than the RF probe and the AE sensor. In one test, the system showed a S/N of 20 for a large arc compared to a S/N of 2 for the RF probe and a S/N of 3 for the AE sensor. In addition, the tests shows an excellent time resolution (~1 msec) compared to the RF probe (~22 msec), AE sensor (~27 msec), and EPD (~10.9 sec).

Another round of tests was conducted to study the spatial resolution of the optical detection system. The tests are conducted with the arcing chip located at the wafer center and with the arching located near the wafer notch. Large arcing signals appeared in all of the channels of the system, and the detected arcing signals appeared at the same time, having similar shape and signal strength. For very small arcing, however, the detected signals have a noticeable difference between channels, indicating that the optical detection system of the present invention has spatial resolution capabilities.

Another set of tests was conducted to detect sparking event after the plasma is turned off. Sparking is observed in all test wafers after the plasma is turned off. Sparking events after the plasma turned off occur in three distinct groups (i.e., small sparks followed by larger sparks followed by small sparks).

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for detection of optical events in a plasma processing system, the method comprising:
    detecting at least one light emission signal, via one or more optical detectors, from a detection area in a plasma processing chamber, the at least one detected light emission signal including light emissions from an optical event and representing an emission intensity in time domain; and
    detecting a signature of the optical event from the at least one detected light emission signal, wherein
    the detection area is divided into multiple overlapping areas in one direction, each one of the multiple overlapping areas in the one direction being covered by a channel of the one or more optical detectors.

2. The method of claim 1, further comprising:
    igniting a plasma in the plasma processing chamber, wherein the at least one light emission signal further includes light emissions from the plasma; and
    processing the at least one light emission signal to suppress a plasma light emission from the emissions from an optical event.

3. The method of claim 2, wherein the optical event is an arcing event.

4. The method of claim 3, wherein the signature of the arcing event includes an optical signal having a power at least three orders of magnitude lower than the power of the optical signal of the plasma light emission.

5. The method of claim 4, further comprising:
    recording the arcing event for fault detection or notifying the plasma processing system operator, or both.

6. The method of claim 1, wherein the detection of the at least one light emission signal is performed with a time resolution of 10 μs, or lower.

7. The method of claim 1, wherein the detection of the at least one light emission signal is performed with a time resolution of 1 μs, or lower.

8. The method of claim 1, wherein the one or more optical detector includes a charged-coupled device (CCD) or a photodiode.

9. The method of claim 1, wherein the one or more optical detectors are configured to monitor more than about 50% of the plasma processing chamber volume, for optical events.

10. The method of claim 1, wherein the one or more optical detectors are configured to simultaneously monitor a substrate, a focus ring, and a capacitive-coupled RF electrode disposed within the plasma processing chamber.

11. The method of claim 1, wherein the at least one light emission signal is collected by two or more wide angle lenses, each wide angle lens being associated with one area of the multiple overlapping areas.

12. The method of claim 2, wherein the processing the at least one light emission signal is performed in a dedicated arcing event controller.

13. The method of claim 1, wherein the processing the at least one light emission signal is performed in a controller that also detects and processes a plasma optical emission spectroscopy (OES) signal.

14. The method of claim 2, wherein the detected light emission includes light emission from an arcing event occurring when the plasma is off during the removal of the chucking force from the substrate.

15. The method of claim 1, wherein the detection of the at least one light emission signal is performed simultaneously with detection of at least one of acoustic emissions from the plasma processing chamber, RF signal in the plasma processing chamber, or plasma optical emission spectra (OES).

16. The method of claim 1, wherein said optical event is an extinguishing event.

17. The method of claim 1, further comprising:
classifying detected arcing events based on detected intensities; and
determining a subsequent action by a plasma processing controller based on the classification.

18. The method of claim 1, wherein the optical event is detected when an intensity of the at least one light emission signal is greater than a threshold value.

19. The method of claim 2, wherein
the one or more optical detectors includes a background light subtraction circuit that generates a current proportional to the background light and is not sensitive to a short light pulse.

20. The method of claim 19, wherein
the one or more optical detectors further includes a photodiode, an integrated circuit operational amplifier, and a resistor.

21. The method of claim 20, wherein
current from the resistor which is proportional to the background light is subtracted from the photodiode current, resulting in the integrated circuit operational amplifier not saturated by the background light.

22. An apparatus for detection of optical events in a plasma processing system, comprising:
a window disposed on a plasma processing chamber of the plasma processing system, for providing optical access to the plasma processing chamber;
at least one optical detector for detecting light emission signal from an optical event from a detection area in the plasma processing chamber via a light collector, the light emission signal representing an emission intensity in time domain; and
a controller configured to
detect a signature of the optical event from the at least one detected light emission signal, wherein the detection area is divided into multiple overlapping areas in one direction, each one of the multiple overlapping areas in the one direction being covered by a channel of the at least one optical detector.

23. A system for plasma processing, comprising:
a plasma processing chamber;
at least one optical detector for detecting light emission from an optical event from a detection area in the plasma processing chamber via a light collector; and
a controller configured to
detect a signature of the optical event from, an intensity of the detected light emission in time domain wherein the detection area is divided into multiple overlapping areas in one direction, each one of the multiple overlapping areas in the one direction being covered by a channel of the at least one optical detector.

* * * * *

UNITED STATES PATENT AND TRADEMARK OFFICE
CERTIFICATE OF CORRECTION

PATENT NO. : 10,692,705 B2
APPLICATION NO. : 15/351916
DATED : June 23, 2020
INVENTOR(S) : Mihail Mihaylov et al.

Page 1 of 1

It is certified that error appears in the above-identified patent and that said Letters Patent is hereby corrected as shown below:

In the Claims

In Column 12, Line 39, Claim 4, delete "power at" and insert -- power of at --, therefor.

In Column 13, Line 1, Claim 13, delete "wherein the" and insert -- wherein --, therefor.

Signed and Sealed this
Twenty-fifth Day of August, 2020

Andrei Iancu
*Director of the United States Patent and Trademark Office*